US012706283B2

(12) United States Patent
Yang et al.

(10) Patent No.: US 12,706,283 B2
(45) Date of Patent: Aug. 11, 2026

(54) SUBSTRATE PROCESSING APPARATUS

(71) Applicant: SEMES CO., LTD., Cheonan-si (KR)

(72) Inventors: Young Hwan Yang, Yongin-si (KR); Soo Ryun Ro, Suwon-si (KR); Jeong Seok Kang, Seongnam-si (KR)

(73) Assignee: SEMES CO., LTD., Cheonan-si (KR)

( * ) Notice: Subject to any disclaimer, the term of this patent is extended or adjusted under 35 U.S.C. 154(b) by 963 days.

(21) Appl. No.: 17/971,613

(22) Filed: Oct. 23, 2022

(65) Prior Publication Data

US 2023/0135026 A1 May 4, 2023

(30) Foreign Application Priority Data

Nov. 1, 2021 (KR) ........................ 10-2021-0147977

(51) Int. Cl.
*H01J 37/32* (2006.01)

(52) U.S. Cl.
CPC .. *H01J 37/32807* (2013.01); *H01J 37/32642* (2013.01); *H01J 2237/024* (2013.01)

(58) Field of Classification Search
CPC ............. H01J 37/3244; H01J 37/32642; H01J 37/32807; H01J 2237/024
See application file for complete search history.

(56) References Cited

U.S. PATENT DOCUMENTS 5,855,679 A * 1/1999 Ogawa .................. C23C 14/564 156/345.1
6,899,786 B2 * 5/2005 Senzaki .............. H01J 37/3288 156/345.43
11,112,773 B2 9/2021 Trussell et al.
2005/0205209 A1 * 9/2005 Mosden ............ H01L 21/67069 156/345.31
2008/0087641 A1 * 4/2008 De La Llera ..... H01J 37/32541 438/689
2010/0093178 A1 * 4/2010 Honda ................ H01J 37/3244 438/719
2016/0362788 A1 * 12/2016 Kurita ............... H01L 21/67748
2018/0032062 A1 * 2/2018 Trussell ............ H01L 21/67167
2021/0183687 A1 6/2021 Yan et al.

FOREIGN PATENT DOCUMENTS

| | | |
|---|---|---|
| CN | 106611727 | 5/2017 |
| JP | 1996-330387 | 12/1996 |
| KR | 10-2007-0010290 | 1/2007 |
| KR | 10-1592858 | 12/2015 |
| KR | 10-2016-0088820 | 7/2016 |
| KR | 10-2017-0047149 | 5/2017 |

OTHER PUBLICATIONS

Office Action from the Korean Intellectual Property Office dated Jul. 18, 2023.

* cited by examiner

*Primary Examiner* — Benjamin Kendall

(57) ABSTRACT

Proposed is a substrate processing apparatus capable of replacing consumables and, more particularly, to a technique for supporting replacement of consumables such as a shower head and a focus ring while maintaining a chamber processing environment of the substrate processing apparatus.

12 Claims, 21 Drawing Sheets

SUBSTRATE PROCESSING APPARATUS

CROSS REFERENCE TO RELATED APPLICATION

The present application claims priority to Korean Patent Application No. 10-2021-0147977, filed Nov. 1, 2021, the entire contents of which is incorporated by reference herein for all purposes.

BACKGROUND OF THE INVENTION

Field of the Invention

The present disclosure relates to a substrate processing apparatus capable of replacing consumables and, more particularly, to a technique for supporting replacement of consumables such as a shower head and a focus ring while maintaining a chamber processing environment of the substrate processing apparatus.

Description of the Related Art

As plasma processing apparatuses, those using a capacitively coupled plasma (CCP) source, an inductively coupled plasma (ICP) source, a plasma wave helicon, and a microwave plasma source have been proposed. Among them, an ICP processing apparatus capable of easily generating a high-density plasma is widely used.

A plasma processing apparatus is used in various fields, and in particular, it is used in various processes such as deposition and etching in the manufacture of semiconductors that require high density and high integration.

When the deposition process by using the plasma processing apparatus is performed, a reaction product is not only deposited on a substrate but also coats a shower head of a process chamber, thereby contaminating the shower head. In addition, when the etching process is performed by using the plasma processing apparatus, by-products generated as a result of substrate etching are deposited on the surface of the shower head, thus contaminating the shower head.

Thus, it is necessary to periodically replace or clean the contaminated shower head. However, for the replacement or cleaning of the shower head, the substrate treatment process itself has to be stopped, and it takes a lot of time to recreate the chamber processing environment.

Moreover, a focus ring, which is utilized for achieving a more uniform plasma distribution, requires periodic replacement due to damage or wear.

In order to replace the focus ring, it is necessary to stop the substrate treatment process and open the process chamber to replace the focus ring, so as in the case of the shower head, it takes a lot of time to recreate the chamber processing environment.

Therefore, it is requisite to propose a technique for replacing consumables while maintaining the internal processing environment of the process chamber.

SUMMARY OF THE INVENTION

Accordingly, the present disclosure has been made keeping in mind the above problems occurring in the related art, and the present disclosure is intended to provide a substrate processing apparatus capable of replacing consumables and, more particularly, a technique for replacing consumables such as a shower head or a focus ring.

When replacing or cleaning a contaminated shower head and when replacing a focus ring, a substrate treatment process of the substrate processing apparatus needs to be stopped, and it takes a lot of time to recreate the chamber processing environment. An objective of the present disclosure is to solve these problems.

The objective of the present disclosure is not limited to the above, and other objectives and advantages of the present disclosure not mentioned may be understood by the following description.

According to an embodiment of the present disclosure, a substrate processing apparatus includes a process chamber provided with a processing space for performing a substrate processing process, a lifting member disposed in the process chamber and supporting a part that constitutes the substrate processing apparatus, wherein the part is located in the processing space and the lifting member is configured to lift or lower the part, a door means provided at a wall surface of the process chamber to selectively provide a passage between the processing space and an exterior to the process chamber according to opening of the door means, and a transport means configured to remove the part from the processing space through the passage of the door means.

According to an embodiment of the present disclosure, a substrate processing apparatus includes a process chamber provided with a processing space for performing a substrate processing process, a focus ring mounted on an outside of a substrate support unit of the process chamber, a shower head disposed in an upper part of the processing space, a detachment means configured to disassemble the shower head from the process chamber, a lifting member positioned under the focus ring and connected to the focus ring or the shower head, a door means provided at a wall surface of the process chamber to selectively provide a passage leading to the processing space according to opening and closing, a buffer chamber connected to the passage of the door means to maintain a processing environment of the process chamber when the passage is opened, and provided with a storage for consumables, and a transport means located in the buffer chamber and configured to be able to enter and exit the processing space through the passage of the door means to transport the focus ring or the shower head.

According to the present disclosure, it is possible to replace consumables such as a shower head and a focus ring while maintaining a chamber processing environment of a substrate processing apparatus.

In particular, when a used shower head or a used focus ring is replaced with a new shower head or a new focus ring, the environment of the process chamber is maintained, so there is no need to recreate the processing environment thereafter, thereby increasing process progress efficiency.

In addition, by configuring the shower head with a plurality of plates, the weight of the replacement shower head can be reduced while sequentially removing a used plate and performing the process with a remaining plate.

The effects of the present disclosure are not limited to those mentioned above, and other effects not mentioned will be clearly understood by those skilled in the art from this specification and accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 2 is a view illustrating an example of lifting and lowering a focus ring by a lifting member in the substrate processing apparatus capable of replacing consumables according to the present disclosure;

FIGS. 7A to 8B are views illustrating yet another example of the shower head and detachment means in the substrate processing apparatus capable of replacing consumables according to the present disclosure;

FIGS. 12A to 12C are views illustrating a process of dismounting and discharging a used shower head in the substrate processing apparatus capable of replacing consumables according to the present disclosure.

DETAILED DESCRIPTION OF THE INVENTION

Hereinafter, embodiments of the present disclosure will be described in detail with reference to the accompanying drawings. However, the present disclosure is not limited by the embodiments.

In order to explain the present disclosure, the operational advantages of the present disclosure, and the objectives achieved by the practice of the present disclosure, embodiments of the present disclosure are exemplified below and will be described with reference to them.

First, the terms used in this application are only used to describe specific embodiments, and are not intended to limit the present disclosure, and the singular expression may include a plural expression unless the context clearly indicates otherwise. In addition, it should be understood that in the present disclosure, terms such as "comprise" or "have" are intended to designate that a feature, number, step, operation, component, part, or combination thereof described in the specification exists, and do not preclude the possibility of addition or existence of one or more other features or numbers, steps, operations, components, parts, or combinations thereof.

In describing the present disclosure, when it is determined that a detailed description of a related known configuration or function may obscure the gist of the present disclosure, the detailed description thereof will be omitted.

The present disclosure proposes a technique for supporting replacement of consumables disposed in a process chamber while maintaining a chamber processing environment of the substrate processing apparatus.

In the following embodiments of the present disclosure, consumables are described as being limited to a shower head and a focus ring, but are not limited thereto, and may include various components, such as rings and liners, which are disposed in the inner space of the process chamber and are contaminated or worn according to process treatment and require periodic replacement.

Figure 1:
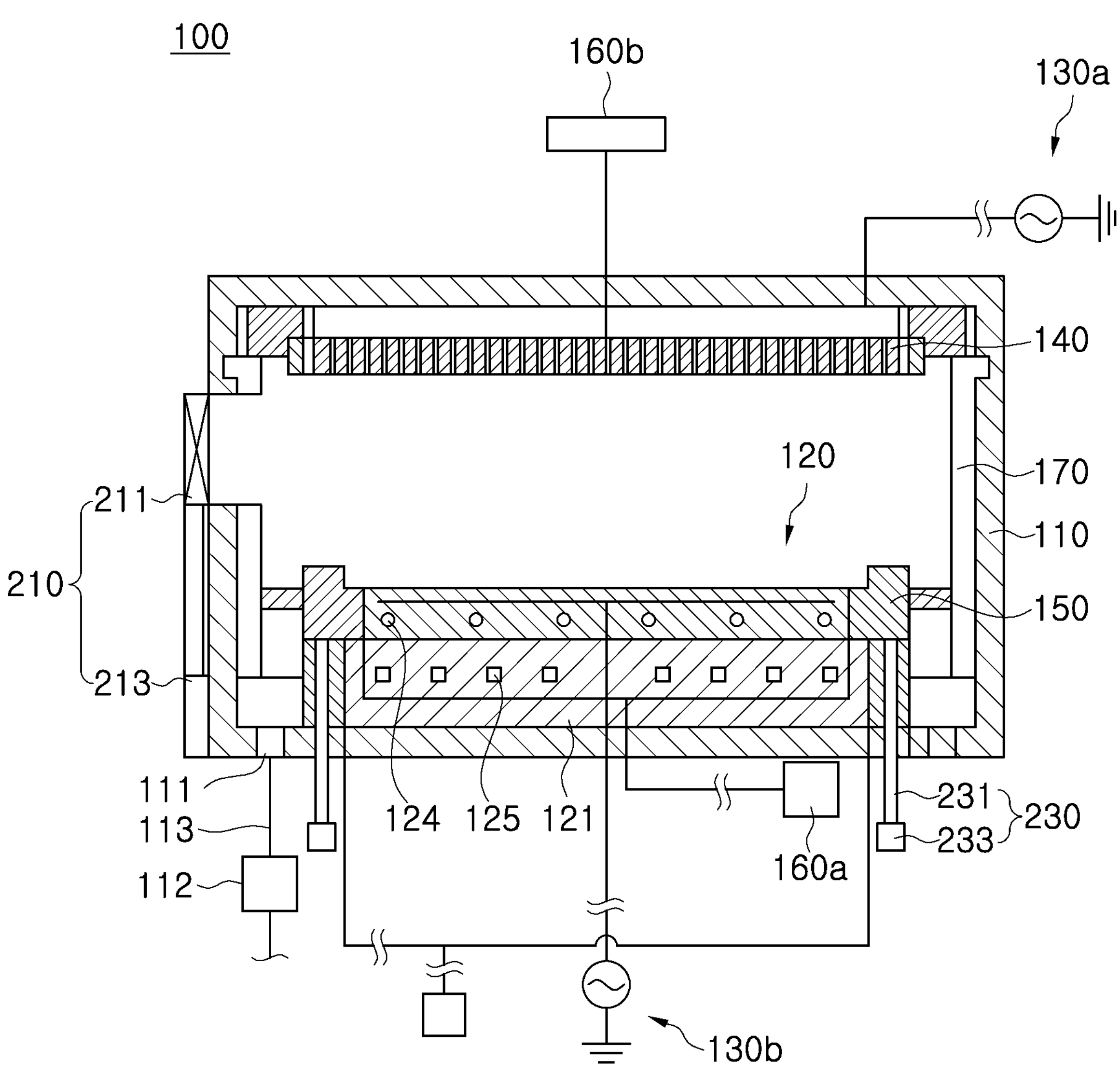
FIG. 1 is a view illustrating an embodiment of a substrate processing apparatus capable of replacing consumables according to the present disclosure.

FIG. 1 is a view illustrating an embodiment of a substrate processing apparatus capable of replacing consumables (i.e., parts constituting the substrate processing apparatus) according to the present disclosure.

The substrate processing apparatus 100 may include a process chamber 110, a substrate support unit 120, plasma generation units 130*a* and 130*b*, a shower head 140, a first gas supply unit 160*a*, a second gas supply unit 160*b*, and a liner or wall-liner 170.

The substrate processing apparatus 100 may be an apparatus for processing a substrate W using a dry etching process. The substrate processing apparatus 100 may process the substrate W using, for example, a plasma process.

The process chamber 110 may provide a processing space in which the plasma process is performed. The process chamber 110 may have an exhaust hole 111 at a lower portion thereof.

The exhaust hole 111 may be connected to the exhaust line 113 on which the pump 112 is mounted. The exhaust hole 111 may discharge a reaction by-product generated during the plasma process and a gas remaining in the process chamber 110 to the outside of the process chamber 110 through an exhaust line 113. In this case, the internal space of the process chamber 110 may be decompressed to a predetermined pressure.

A door means 210 may be provided on a sidewall of the process chamber 110. The door means 210 may serve as a passage for transporting consumables into the inner processing space of the process chamber 110.

The door means 210 may include a door 211 and a door actuator 213. The door 211 may be opened and closed according to the operation of the door actuator 213 while forming a part of the outer wall of the process chamber 110, and through this, may selectively provide a passage connected to the processing space of the process chamber 110. The door actuator 213 may lift and lower the door 211 by including a hydraulic cylinder, a motor, and the like.

The substrate support unit 120 may be installed in an inner lower region of the process chamber 110. An electrostatic chuck for supporting the substrate W using electrostatic force may be applied to the substrate support unit 120, but other means for mounting and supporting the substrate in various ways may be applied. For example, the substrate support unit 120 may support the substrate W in various ways such as mechanical clamping, vacuum, and the like.

A focus ring 150 may be disposed outside the substrate support unit 120. The focus ring 150 may be provided in a ring shape and configured to support an edge region of the substrate W. The focus ring 150 may be made of a silicone material, and may focus plasma to the substrate W. The focus ring 150 may be coupled to a base 121 of the substrate support unit 120 using a clamp, an O-ring, or the like.

In addition, an insulation ring (not shown) surrounding the focus ring 150, an edge ring (not shown) in close contact with the rim of the focus ring 150 may be disposed outside the focus ring 150.

The first gas supply unit 160*a* may supply a gas for removing foreign substances remaining on the upper portion of the focus ring 150 or the substrate support unit 120.

The first gas supply unit 160*a* may supply nitrogen gas (N2 gas) as a gas for removing foreign substances, but is not limited thereto. For example, the first gas supply unit 160*a* may supply other gases or cleaning agents.

A heating member 124 and a cooling member 125 of the substrate support unit 120 may be provided to allow the substrate W to maintain a process temperature while a treatment process is being performed inside the process chamber 110. To this end, the heating member 124 may include a heating wire, and the cooling member 125 may include a cooling line through which a refrigerant flows.

The heating member 124 and the cooling member 125 may be installed inside the substrate support unit 120 to allow the substrate W to maintain a process temperature.

The plasma generation units 130*a* and 130*b* may generate plasma from the gas remaining in a discharge space. The discharge space may be a space positioned above the substrate support unit 120 among the processing spaces of the process chamber 11.

The plasma generation units 130*a* and 130*b* may generate plasma in the discharge space inside the process chamber 110 using a capacitively coupled plasma (CCP) source. In this case, the plasma generation unit may use the shower head 140 as an upper electrode, and when the substrate support unit 120 provides an electrostatic chuck, the electrostatic chuck may be used as a lower electrode.

As another example, it is also possible for the plasma generation units 130*a* and 130*b* to generate plasma in the discharge space inside the process chamber 110 using an inductively coupled plasma (ICP) source. In this case, the plasma generation units 130*a* and 130*b* use an antenna (not shown) installed on the upper portion of the process chamber 110 as an upper electrode, and use the electrostatic chuck of the substrate support unit 120 as a lower electrode.

The plasma generation units 130*a* and 130*b* may include an upper electrode, a lower electrode, an upper power supply, and a lower power supply.

When the plasma generation units 130*a* and 130*b* use the CCP source, the shower head 140 may function as an upper electrode, and the electrostatic chuck of the substrate support unit 120 may function as a lower electrode, and the shower head 140 functioning as an upper electrode and the electrostatic chuck functioning as a lower electrode may be installed to face up and down inside the process chamber 110. The shower head 140 may include a plurality of gas feeding holes to inject gas into the process chamber 110.

The shower head 140 may be made of a silicone material or a metal material.

In addition, a detachment means for mounting/dismounting the shower head 140 on/from the process chamber 110 may be provided. As an example, the detachment means may mount and dismount the shower head 140 in a clamp-fastening manner.

The upper plasma generation unit 130*b* may be provided to control characteristics of plasma. For example, the upper plasma generation unit 130*b* may be provided to modulate ion bombardment energy. A plurality of power sources of the upper plasma generation unit 130*b* may be provided. In this case, a first matching network (not shown) electrically connected to the plurality of power sources of the upper plasma generation unit 130*b* may be further included.

The first matching network may match and apply different magnitudes of frequency power input from each upper power source to the shower head 140.

The lower plasma generation unit 130*a* may apply power to the electrostatic chuck of the substrate support unit 120. The power of the lower plasma generation unit 130*a* may serve as a plasma source for generating plasma, or may serve to control characteristics of plasma together with the power of the upper plasma generation unit 130*b*.

A plurality of power sources of the lower plasma generation unit 130*a* may be provided, and a second matching network (not shown) electrically connected to the plurality of power sources of the lower plasma generation unit 130*a* may be further included.

The second matching network may match and apply different magnitudes of frequency power input from each lower power source to the electrostatic chuck of the substrate support unit 120.

The second gas supply unit 160*b* may supply a process gas to the internal processing space of the process chamber 110 through the shower head 140. The second gas supply unit 160*b* may include a second gas supply source and a second gas supply line.

The second gas supply unit 160*b* may supply an etching gas as a process gas used to process the substrate W. The second gas supply unit 160*b* may supply a gas including a fluorine element as the etching gas. For example, a gas such as SF6 or CF4 may be supplied as the etching gas.

The second gas supply unit 160*b* may provide the process gas to the shower head 140 so that the etching gas may be introduced into the inner space of the process chamber 110 through the gas feeding holes of the shower head 140.

Meanwhile, when the shower head 140 is divided into a center zone, a middle zone, an edge zone, etc., the second gas supply unit 160*b* may further include a gas distributor (not shown) and a gas distribution line (not shown) to supply a process gas to each region of the shower head 140.

The second gas supply unit 160*b* may further include a second gas supply source (not shown) for supplying a deposition gas.

The second gas supply source may supply gas to the shower head 140 to protect the side surface of the substrate W pattern to enable anisotropic etching. The second gas supply source may supply a gas such as C4F8 or C2F4 as the deposition gas.

The liner 170 may protect the inner surface of the process chamber 110 from an arc discharge generated while the process gas is excited, impurities generated during a substrate processing process, and the like. The liner 170 may be provided in the inside of the process chamber 110 in a cylindrical shape with an upper part and a lower part open.

A lifting member 230 may lift lower consumables while supporting the consumables in the processing space. The lifting member 230 may include a lifting shaft 231 and a lifting actuator 233.

By the operation of the lifting actuator 233, the lifting shaft 231 may be lifted and lowered to mount consumables at the corresponding position or to position consumables dismounted from the corresponding position at the height of the passage of the door means 210.

For example, for a replacement of the focus ring 150, the lifting member 230 may lift a used focus ring to support unloading of the used focus ring through the passage of the door means 210, or lower a new focus ring introduced through the passage of the door means 210 to be mounted on the outside of the substrate support unit 120.

Moreover, for a replacement of the shower head 140, the lifting member 230 may lower a used shower head to support unloading of the used shower head through the passage of the door means 210, or lift a new shower head introduced through the passage of the door means 210 to be mounted in the process chamber 110.

In the substrate processing apparatus 100 as described above, there are consumables that are contaminated or worn as a result of performing a substrate processing process. For example, as the deposition and etching processes are performed, the shower head may be contaminated, and the focus ring may be contaminated and worn. Thus, these consumables require periodic replacement or cleaning.

The substrate processing apparatus 100 according to the present disclosure is configured such that, by the lifting member 230, consumables such as the focus ring 150 or the shower head 140 may be lifted or lowered for mounting and dismounting, and by the role of the door means 210, a used focus ring or shower head may be taken out and a new focus ring or shower head may be brought in through the passage that is opened or closed. In this case, consumables such as a focus ring or a shower head may be transported by a transport means.

A configuration in which consumables are dismounted or mounted and transported in the substrate processing apparatus 100 according to the present disclosure will be described in more detail through embodiments.

Figure 2:
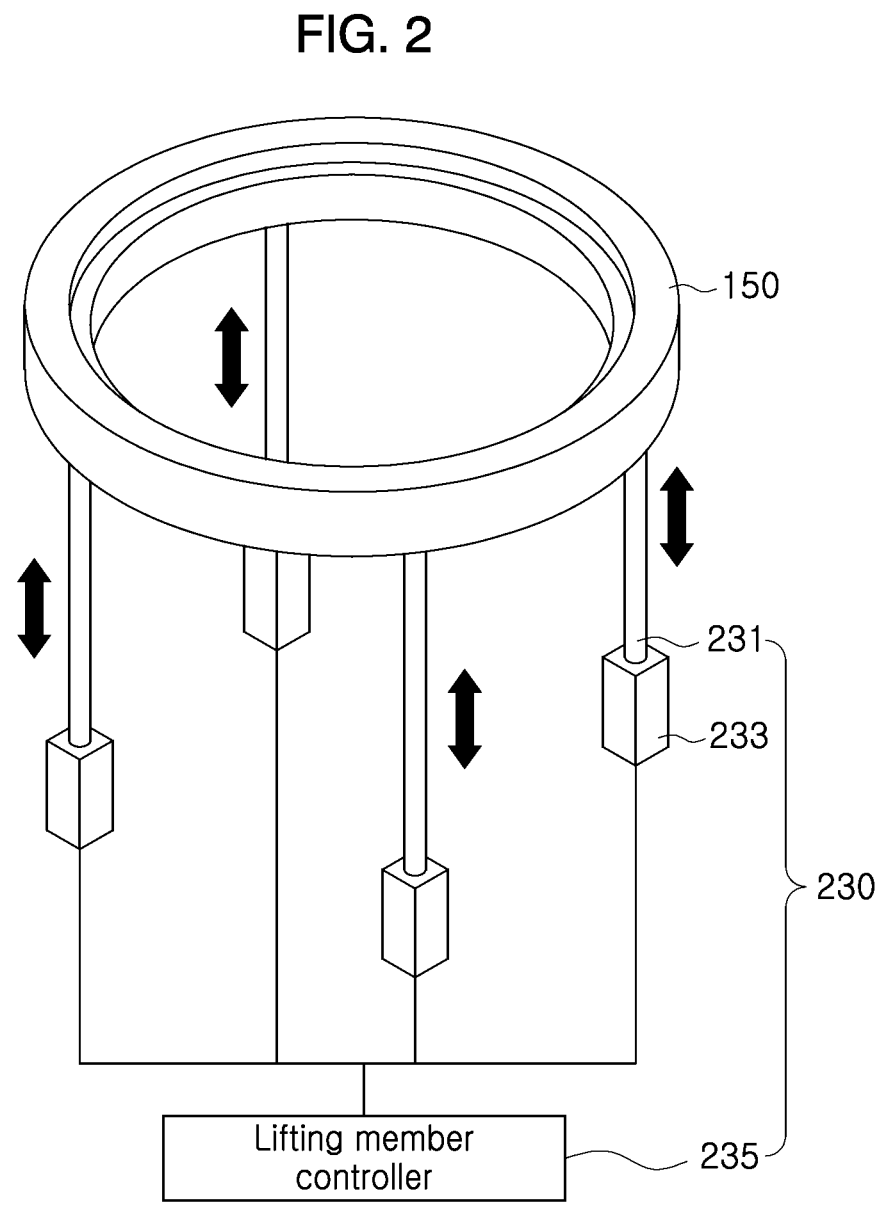

FIG. 2 is a view illustrating an example of lifting and lowering a focus ring by a lifting member in the substrate processing apparatus capable of replacing consumables according to the present disclosure.

The lifting member 230 may lift and lower consumables while supporting the consumables in the processing space of the process chamber.

When the focus ring 150 is dismounted or mounted in FIG. 2, the focus ring 150 may be lifted and lowered by the lifting member 230 disposed under the focus ring 150.

The lifting member 230 may include the lifting shaft 231 and the lifting actuator 233.

A plurality of lifting shafts 231 are disposed along the circumference of the focus ring 150 to support the focus ring 150, and the lifting actuator 233 may lift and lower the focus ring 150 by moving the lifting shaft 231 in the vertical direction.

In addition, the lifting member 230 includes a lifting member controller 235, and the lifting member controller 235 controls the lifting actuator 233 so that the focus ring 150 may be mounted on or dismounted from the periphery of the substrate support unit 120 of the process chamber 110 according to the movement of the lifting shafts 231.

For example, the lifting member controller 235 lifts the lifting shafts 231 under the control of the lifting actuator 233 to separate a used focus ring supported by the lifting shafts 231 from the substrate support unit 120 and to position the used focus ring at the height of the passage of the door means 210.

Similarly, the lifting member controller 235 lowers the lifting shafts 231 under the control of the lifting actuator 233 to mount a new focus ring supported by the lifting shafts 231 around the substrate support unit 120.

Figure 3:
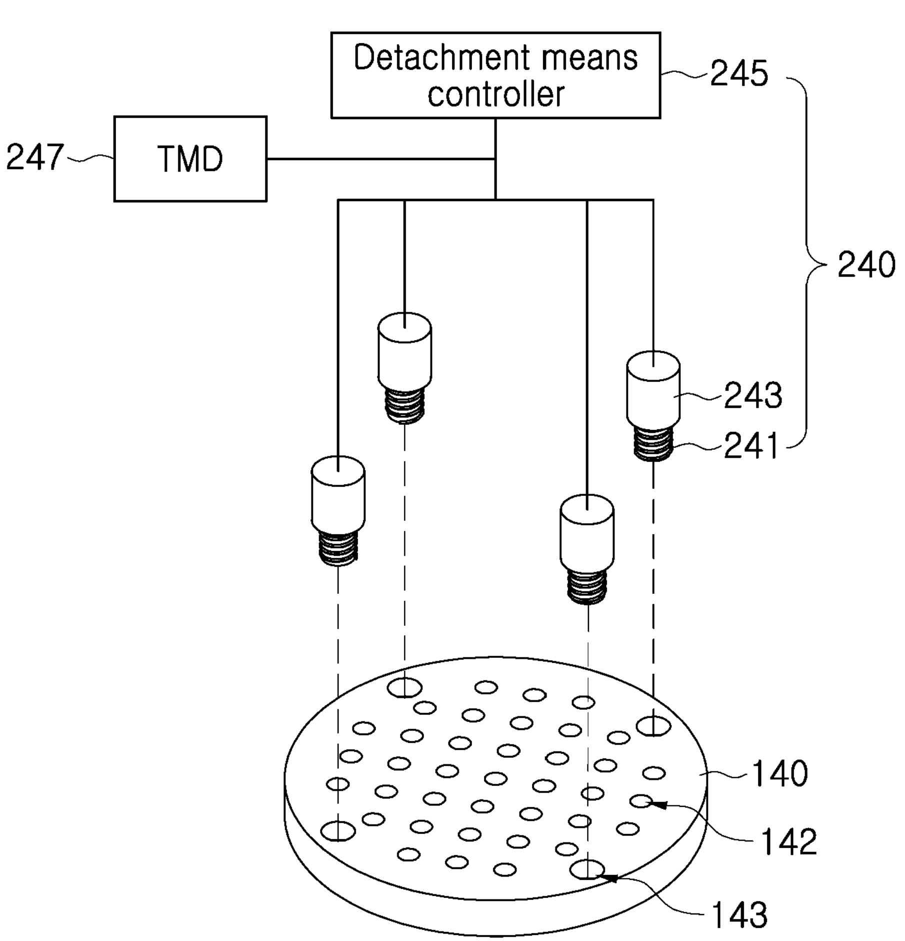
FIG. 3 is a view illustrating a configuration in which a shower head is dismounted by a detachment means in the substrate processing apparatus capable of replacing consumables according to the present disclosure.
Figure 4:
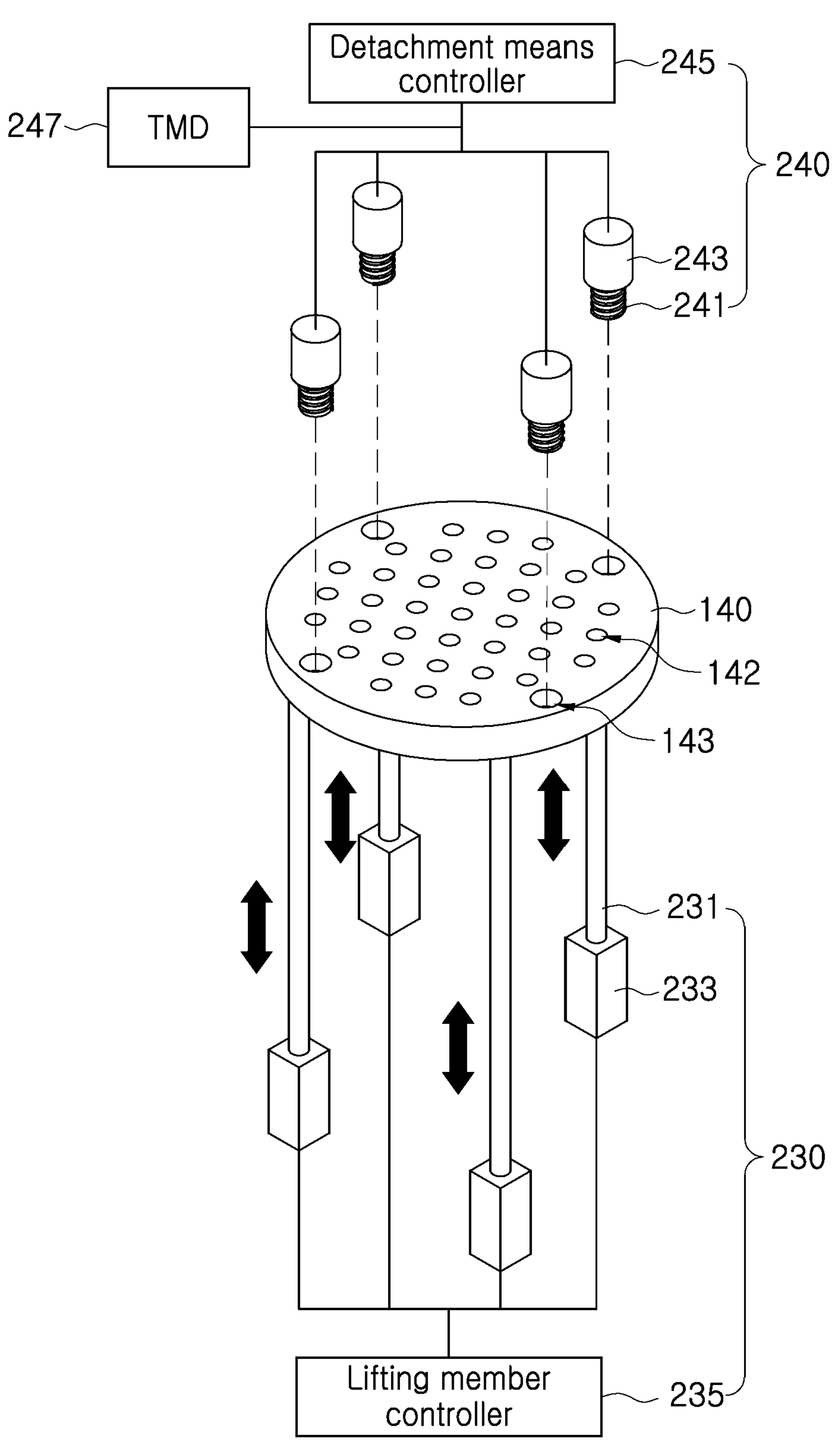
FIG. 4 is a view illustrating an example of dismounting, and lifting and lowering the shower head in the substrate processing apparatus capable of replacing consumables according to the present disclosure.

FIG. 3 is a view illustrating a configuration in which a shower head is dismounted by a detachment means in the substrate processing apparatus capable of replacing consumables according to the present disclosure, and FIG. 4 is a view illustrating an example of dismounting, and lifting and lowering the shower head in the substrate processing apparatus capable of replacing consumables according to the present disclosure.

The shower head 140 may be mounted in the upper part of the processing space of the process chamber 110, and the detachment means 240 may be disposed in the upper side of the processing space of the process chamber 110.

As an example, the detachment means 240 may include: a fastening member 241 provided with a screw thread to be fastened to the shower head; and a fastening actuator 243 connected to the end of the fastening member 241 to rotate the fastening member 241. A plurality of fastening parts 143 may be provided in the shower head 140 along the outer circumferential direction of the gas feeding hole 142. The fastening part 143 of the shower head 140 may be fastened to correspond to the fastening member 241. In an embodiment, when the fastening member 241 has an outer surface with a screw thread, the fastening part 143 is a hole with a corresponding thread for the screw thread of the fastening member 241. The fastening member 241 may screw into the hole of the fastening part 143 such that the shower head 140 is secured by the detachment means 240.

In addition, the detachment means 240 includes a detachment means controller 245, and the detachment means controller 245 controls the fastening actuator 243, and as the fastening member 241 rotates by the fastening actuator 243, the fastening member 241 may be fastened to or detached from the fastening part 143 of the shower head 140.

Furthermore, a torque measurement device (TMD) (247) for measuring the coupling strength when the fastening members 241 are fastened to the shower head 140 may be provided, and the detachment means controller 245 may control the fastening actuator 243 on the basis of the measured coupling strength to fasten the shower head 140 on the fastening members 241. In an embodiment, the torque measurement device may include a torque sensor such as a Cabot torque sensor, a contactless torque sensor, and an automotive torque sensor.

The lifting shaft 231 of the lifting member 230 may ascend to the lower surface of the shower head 140 mounted on the upper processing space of the process chamber 110, and the plurality of lifting shafts 231 may be disposed along the outer circumference of the shower head 140 to support the shower head 140 when the shower head 140 is mounted or dismounted.

For example, when the detachment means 240 separates the shower head 140, the dismounted shower head 140 may be supported by the lifting shafts 231. Additionally, in a state in which the shower head 140 is supported by the lifting shafts 231, the detachment means 240 may mount the shower head 140.

In addition, the lifting member controller 235 of the lifting member 230 controls the lifting actuator 233 to lift and lower the lifting shafts 231 to move the shower head 140 between the mounting position and the passage position of the door means 210.

Figure 5:
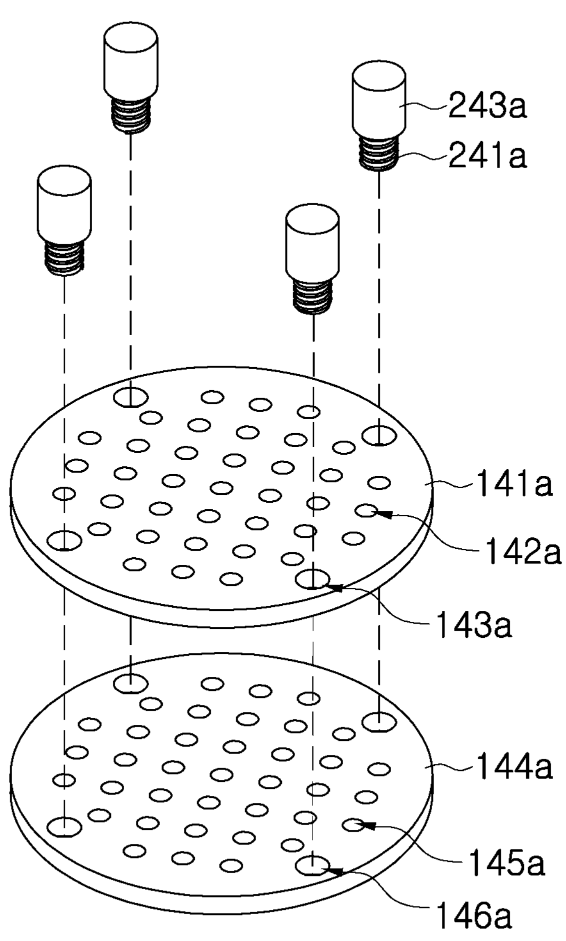
FIGS. 5, 6A, and 6B are views illustrating another example of the shower head and detachment means in the substrate processing apparatus capable of replacing consumables according to the present disclosure.
Figure 6A:
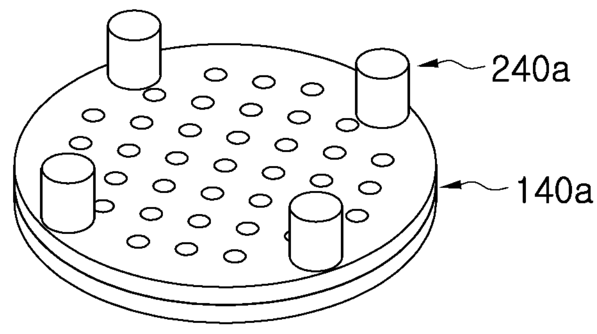
Figure 6B:
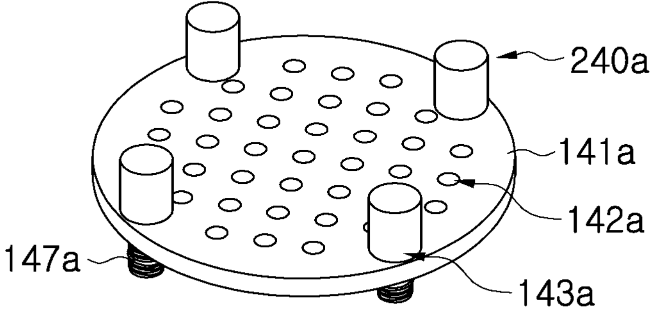
Figure 6B:
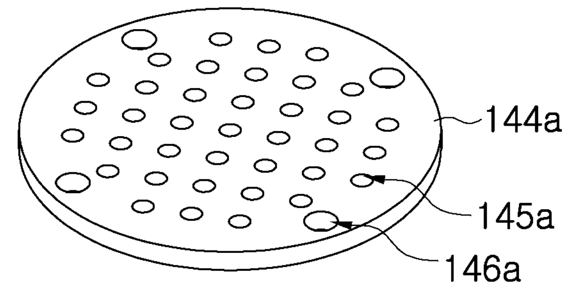
Figures 7A, 7B:
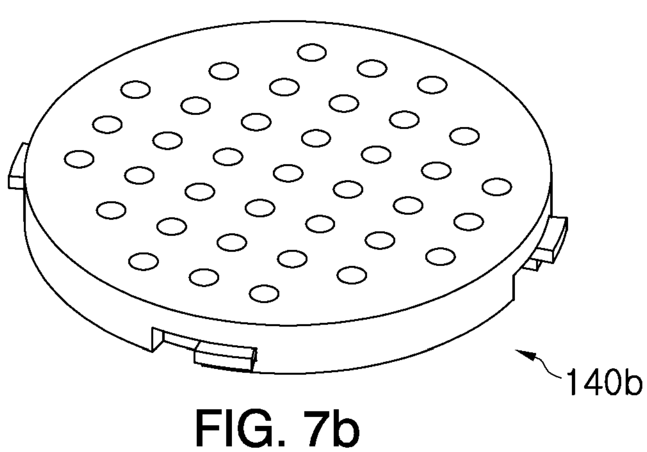
Figure 8A:
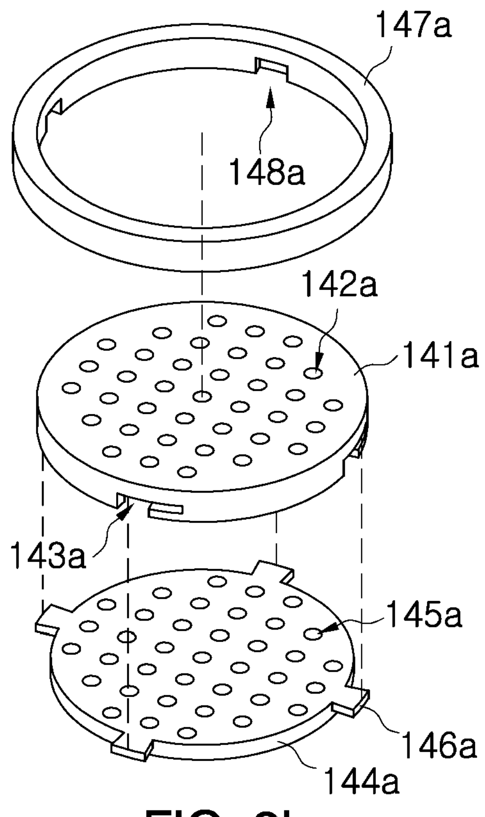
Figure 8B:
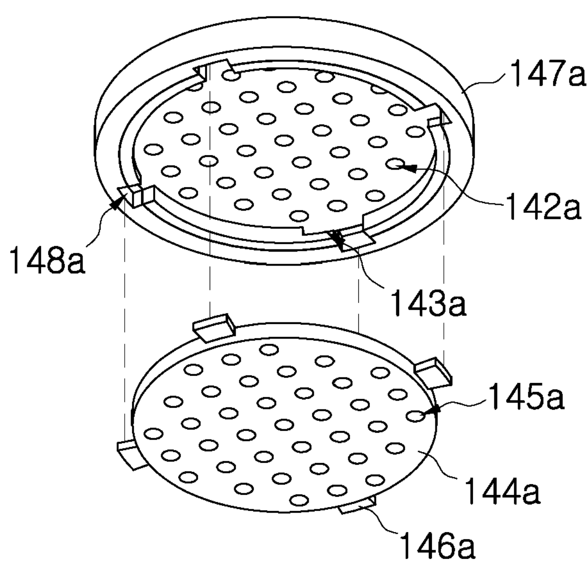

FIGS. 5, 6A, and 6B are views illustrating another example of the shower head and detachment means in the substrate processing apparatus capable of replacing consumables according to the present disclosure.

A shower head **140*a* may have a structure in which a fixed plate 141*a* and a replacement plate 144*a*** are stacked.

The fixed plate **141*a* and the replacement plate 144*a* are provided with gas feeding holes 142*a* and 145*a* and fastening parts 143*a* and 146*a* which correspond to each other and communicate with each other, respectively. The shower head 140*a*** may be provided in a structure in which the fixed plate

141*a* and the replacement plate 144*a* are sequentially fastened and stacked on fastening members 241*a* of a detachment means 240*a*.

The fixed plate 141*a* and the replacement plate 144*a* may be sequentially fastened on the fastening members 241*a* according to the operation of the fastening actuator 243, and according to the operation of the fastening actuator 243, only the replacement plate 144*a* may be separated from or fastened on the fastening members 241*a*.

Furthermore, a torque measurement device for measuring the coupling strength when the fastening members 241*a* are fastened to the shower head 140*a* may be provided, and the detachment means controller may control the fastening actuator 243*a* on the basis of the measured coupling strength to fasten the shower head 140*a* on the fastening members 241*a*.

Since the replacement plate 144*a* is directly exposed on the processing space of the process chamber 110, the replacement plate 144*a* may be relatively more contaminated than the fixed plate 141*a* as the process progresses. Thus, only the replacement plate 144*a* may be periodically replaced depending on the degree of contamination.

In an embodiment, in the shower head 140*a*, it is possible that the replacement plate 144*a* is used first and removed when it is contaminated, and then the fixed plate 141*a* is used, and when the fixed plate 141*a* also needs to be replaced due to contamination, a new fixed plate 141*a* and a new replacement plate 144*a* may be mounted while removing the used fixed plate 141*a*.

In addition, the fixed plate 141*a* and the replacement plate 144*a* may be replaced as the above-described lifting member lifts and lowers while supporting the fixed plate 141*a* and the replacement plate 144*a*.

Moreover, in the shower head 140*a*, the fixed plate 141*a* and the replacement plate 144*a* may be mounted and separated by a clamp-fastening method, and a detachment means may be provided corresponding thereto.

FIGS. 7A to 8B are views illustrating yet another example of the shower head and detachment means in the substrate processing apparatus capable of replacing consumables according to the present disclosure.

In FIGS. 7A to 8B, a shower head 140*b* has a structure in which the fixed plate 141*a* and the replacement plate 144*a* are stacked, and fastening protrusions 146*b* are engaged with fastening grooves 143*b* to be fastened.

The fastening grooves 143*b* are provided on the outer periphery of the fixed plate 141*a*, and the fastening protrusions 146*b* are provided on the outer periphery of the replacement plate 144*a*, so that the replacement plate 144*a* may be coupled to the fixed plate 141*a*.

The detachment means includes a rotation ring 147*a*, and the rotation ring 147*a* may be provided with detachment grooves 148*a* in which the fastening protrusions 146*b* of the replacement plate 144*a* are engaged.

As the rotation ring 147*a* rotates in a state in which the fastening protrusions 146*b* of the replacement plate 144*a* are engaged with the detachment grooves 148*a* of the rotation ring 147*a*, the replacement plate 144*a* may be coupled to or separated from the fixed plate 141*a*.

In addition, the fixed plate 141*b* and the replacement plate 144*b* may be replaced as the above-described lifting member lifts and lowers while supporting the fixed plate 141*b* and the replacement plate 144*b*.

As described above, consumables such as a focus ring or a shower head may be configured in various ways, and may be variously modified in order to facilitate replacement.

Figure 9:
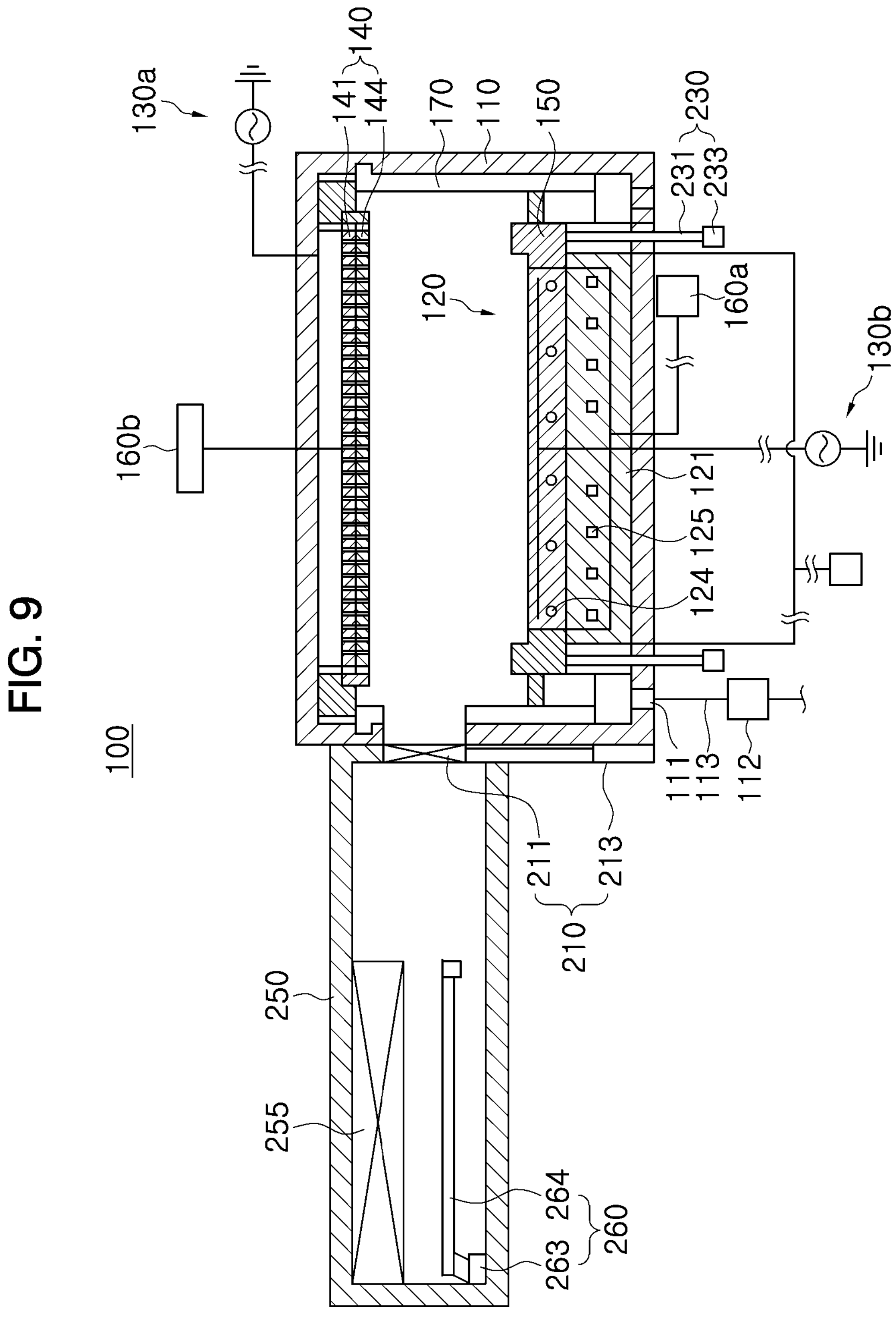
FIG. 9 is a view illustrating another embodiment of a substrate processing apparatus capable of replacing consumables according to the present disclosure.

FIG. 9 is a view illustrating another embodiment of a substrate processing apparatus capable of replacing consumables according to the present disclosure.

In describing the embodiment of FIG. 9, descriptions of parts overlapping with the embodiment of FIG. 1 described above will be omitted.

A buffer chamber 250 may be provided outside the transport passage of consumables provided through the door 211 of the door means 210. The buffer chamber 250 may be installed to be in contact with the outer wall of the process chamber 110 to seal the inner space of the process chamber 110.

The inner space of the buffer chamber 250 may be created in the same environment as the internal processing environment of the process chamber 110. When the inner space of the process chamber 110 and the inner space of the buffer chamber 250 communicate with each other according to the opening of the door 211 of the door means 210, the processing environment created in the inner space of the process chamber 110 may be maintained since the inner space of the buffer chamber 250 is created under the same environmental conditions as the processing environment of the process chamber 110.

A transport means 260 may be disposed in the buffer chamber 250. The transport means 260 may include a transport robot that unloads used consumables from the inside of the process chamber 110 into the buffer chamber 250 and brings new consumables into the process chamber 110 from the inside of the buffer chamber 250.

As an example, the transport robot may include a robot arm 264 and a robot arm actuator 263.

Under the control of the robot arm actuator 263, the robot arm 264 may have a structure in which the length is increased in multiple stages or may adopt a structure with a plurality of swivable joints, and thus, the robot arm 264 may enter the inner space of the process chamber 110 from the inner space of the buffer chamber 250 through the passage formed by the door means 210.

When the lifting shafts 231 ascend or descend, while supporting used consumables, to the height of the passage formed by the door means 210, the robot arm 264 may enter the inner space of the process chamber 110 and take over the used consumables supported by the lifting member 230. When the robot arm 264 introduces new consumables into the passage formed by the door means 210, the lifting shafts 231 may ascend or descend and take over the new consumables supplied by the robot arm 264.

Furthermore, a storage 255 for storing consumables may be provided in the inner space of the buffer chamber 250, and used consumables may be stored in the storage when transporting used consumables from the process chamber 110 to the buffer chamber 250 by the transport robot. The transport robot may also supply new consumables stored in the storage to the inner space of the process chamber 110.

Due to the substrate processing apparatus capable of replacing consumables according to the present disclosure as described above, it may be possible to replace the consumables while maintaining the processing environment of the process chamber as it is.

A process of replacing consumables by using the substrate processing apparatus capable of replacing consumables according to the present disclosure will be described in more detail with examples.

The process of replacing consumables will be described by applying the embodiment according to the present disclosure of FIG. 9 described above.

Figure 10A:
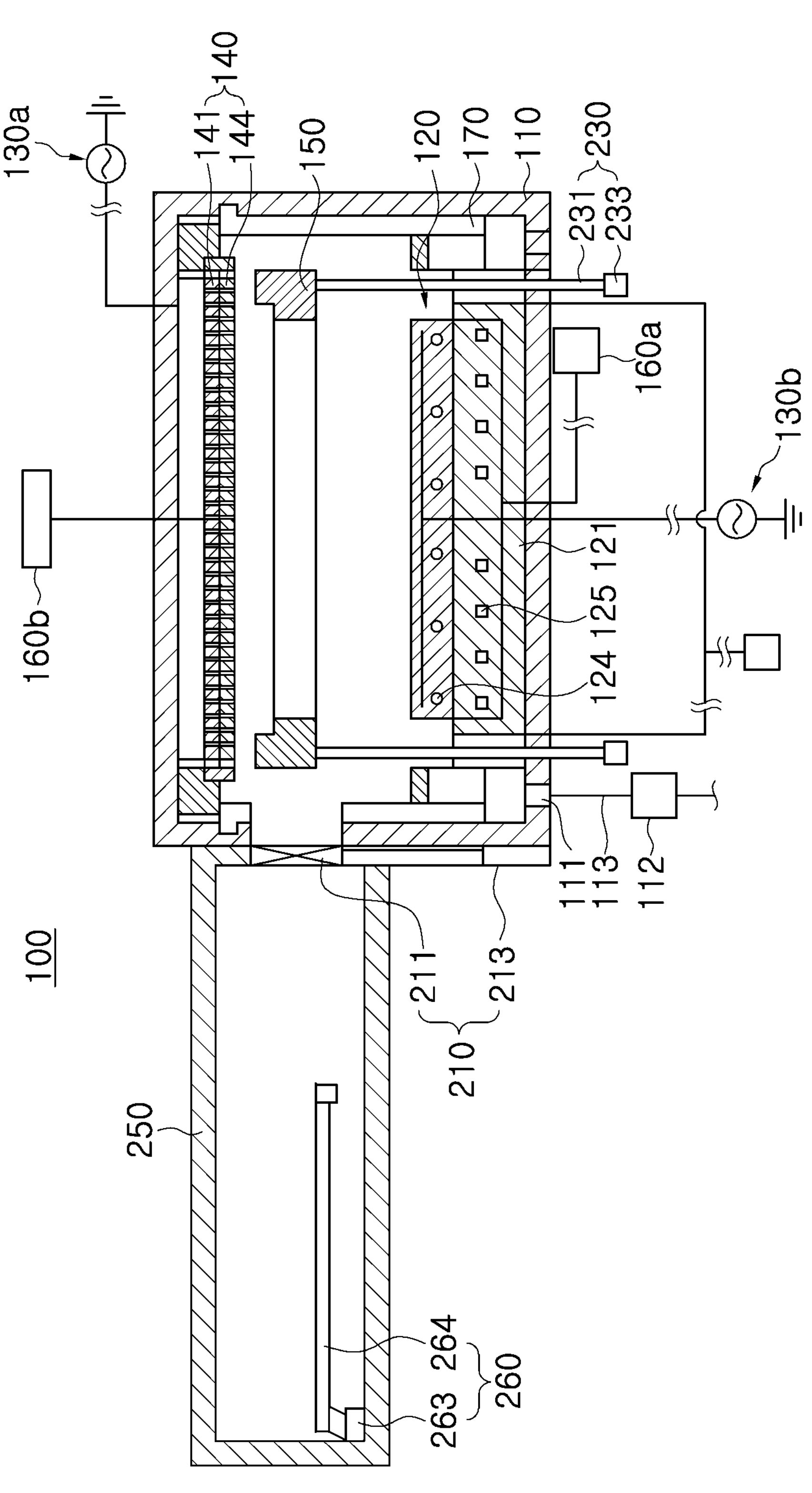
FIGS. 10A to 10C are views illustrating a process of dismounting and discharging a used focus ring in the substrate processing apparatus capable of replacing consumables according to the present disclosure.
Figure 10B:
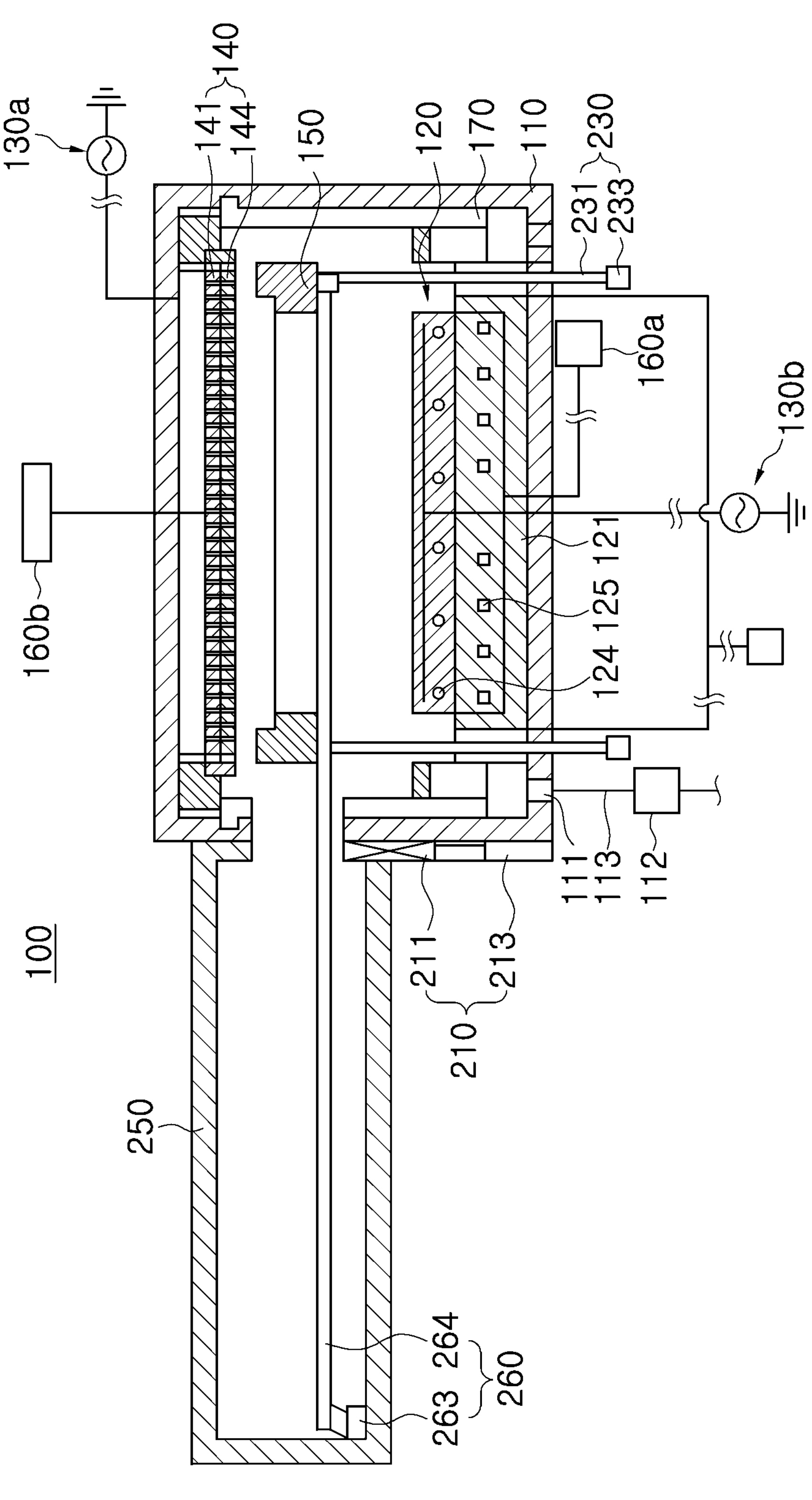
Figure 10C:
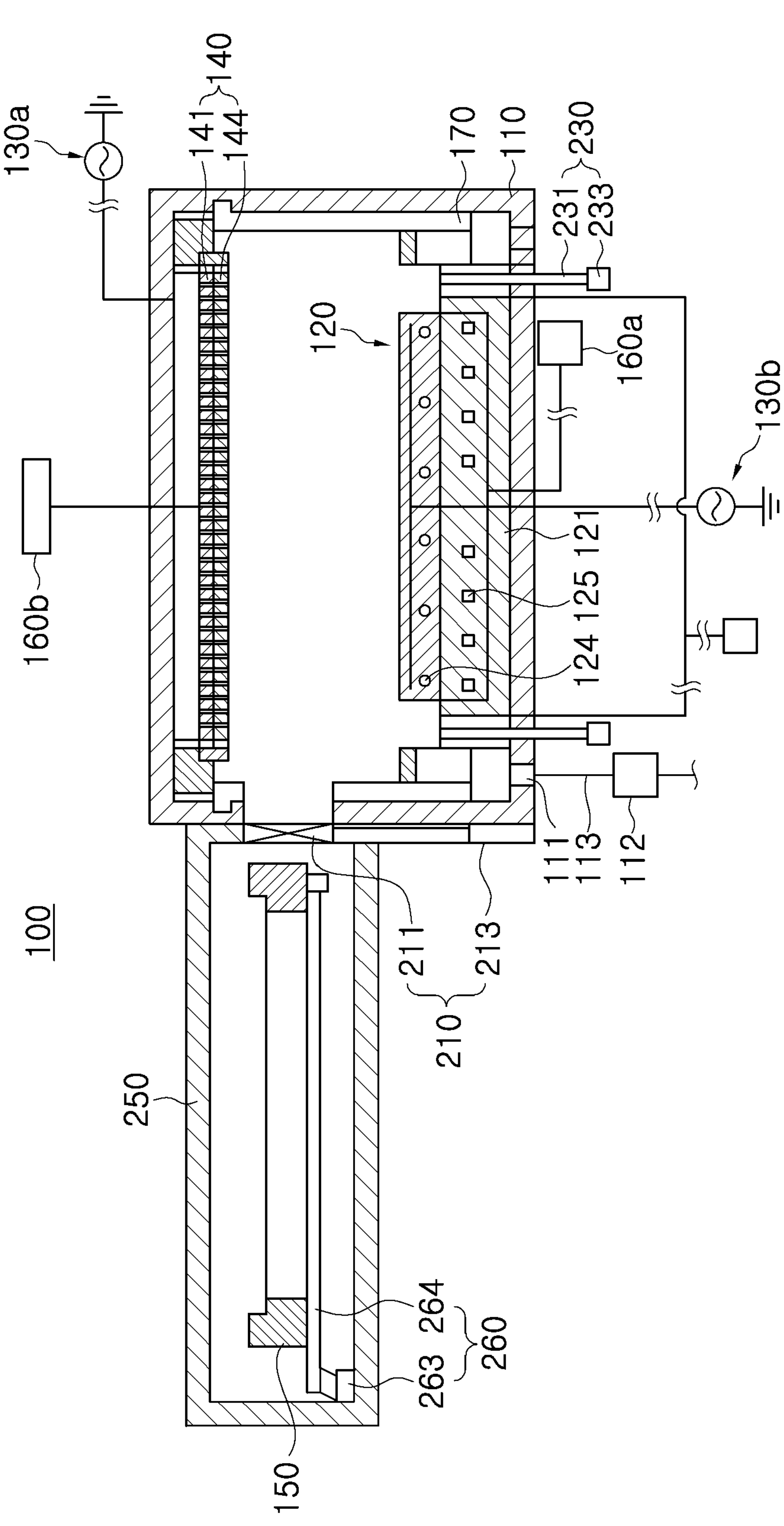

FIGS. 10A to 10C are views illustrating a process of dismounting and discharging a used focus ring in the substrate processing apparatus capable of replacing consumables according to the present disclosure.

When the focus ring 150 is contaminated or worn and needs to be replaced, the lifting shafts 231 of the lifting member 230 positioned under the focus ring 150 ascend to dismount and lift the focus ring 150 mounted around the substrate support unit 120 as shown in FIG. 10A. The lifting shafts 231 may ascend so that the focus ring 150 is positioned at the height of the door 211 of the door means 210.

In a state in which the used focus ring 150 is lifted to the height of the door 211, a passage may be formed by opening the door 211 of the door means 210. As shown in FIG. 10B, the robot arm 264 of the transport means 260 may enter the inside of the process chamber 110 through the passage, and take over the used focus ring 150 supported by the lifting shafts 231.

In addition, as shown in FIG. 10C, the robot arm 264 may return to the inner space of the buffer chamber 250 while supporting the used focus ring 150. The used focus ring 150 may be stored in the storage provided in the buffer chamber 250.

Figure 11A:
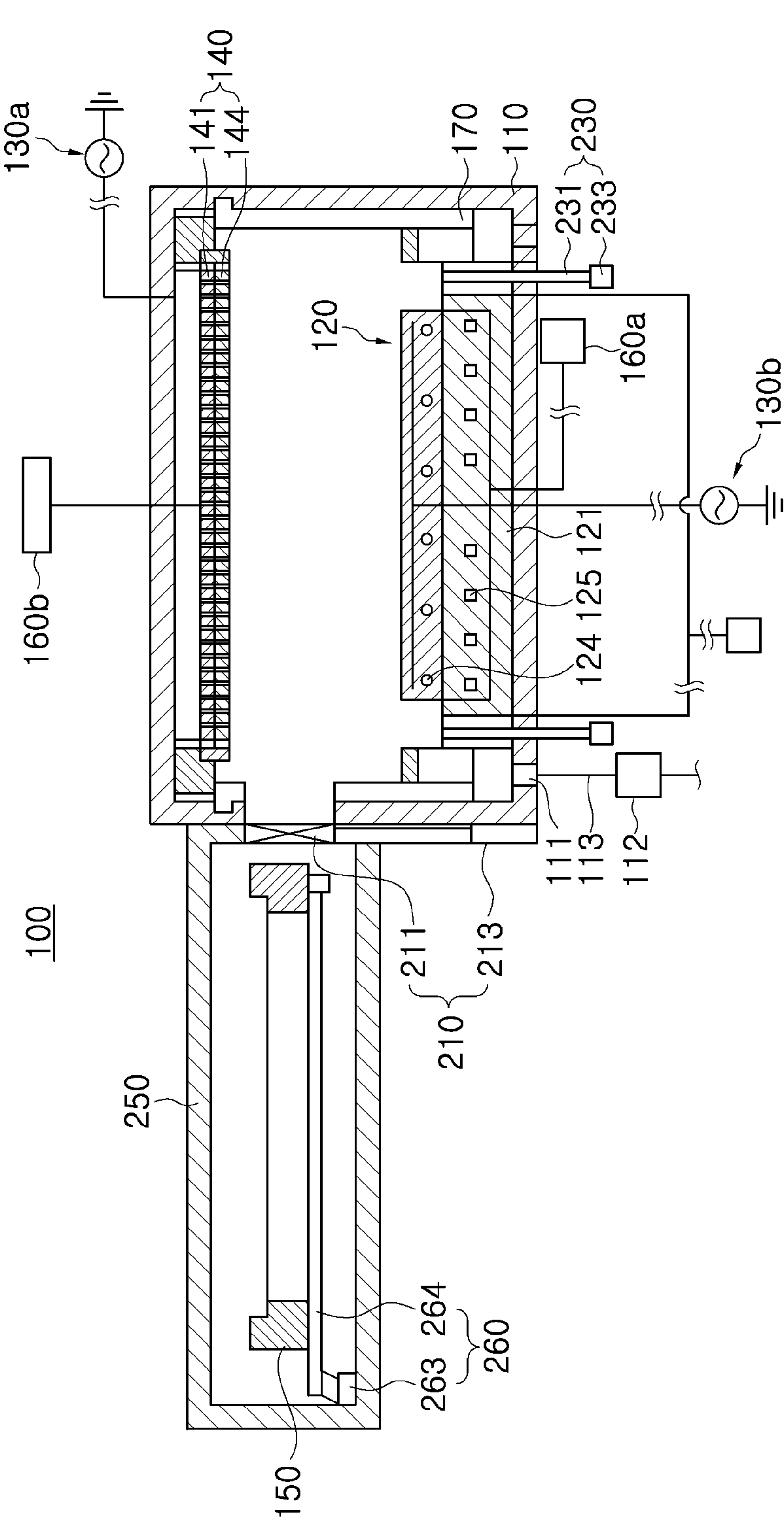
FIGS. 11A to 11C are views illustrating a process of bringing in and mounting a new focus ring in the substrate processing apparatus capable of replacing consumables according to the present disclosure.
Figure 11B:
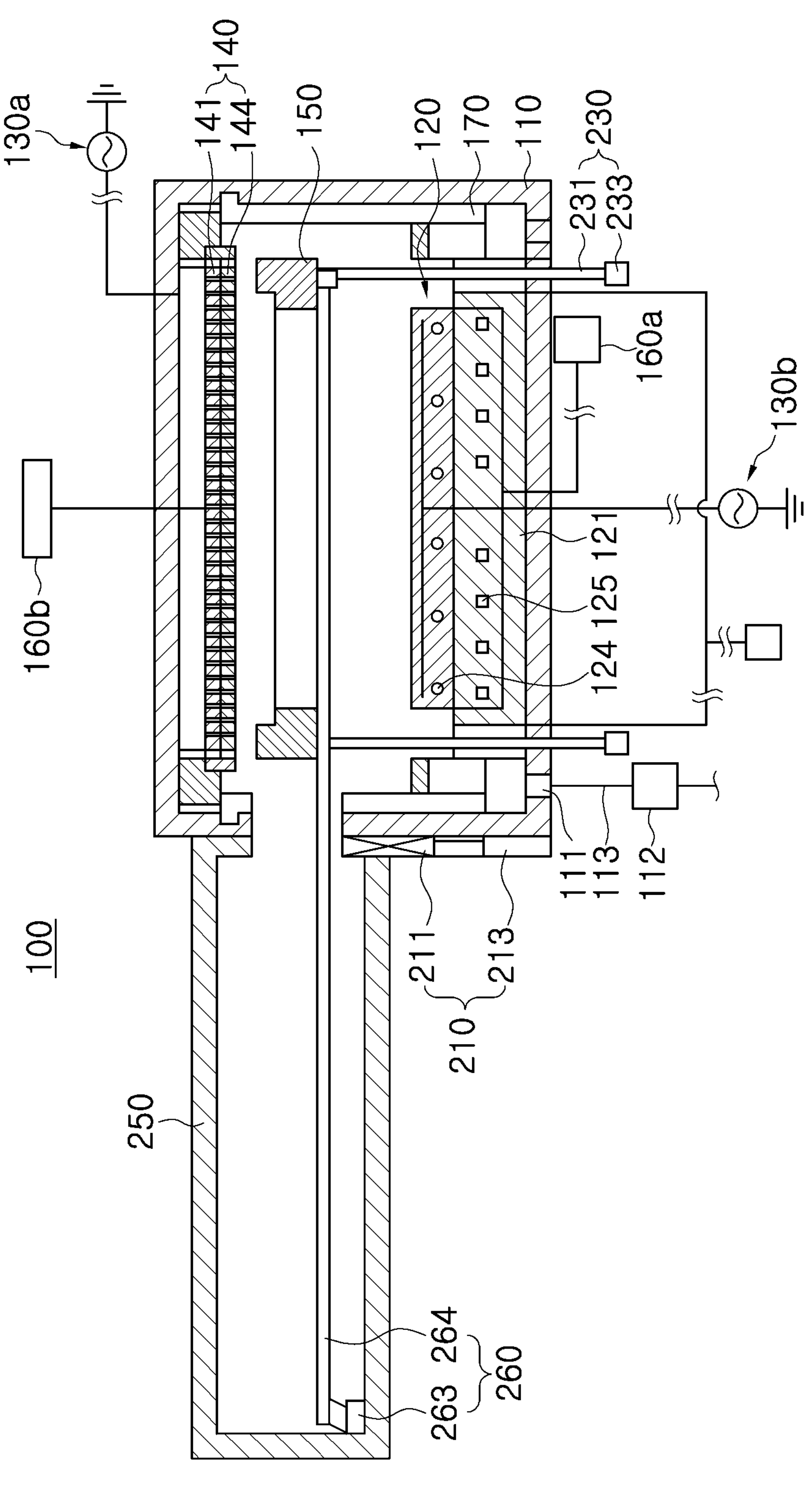
Figure 11C:
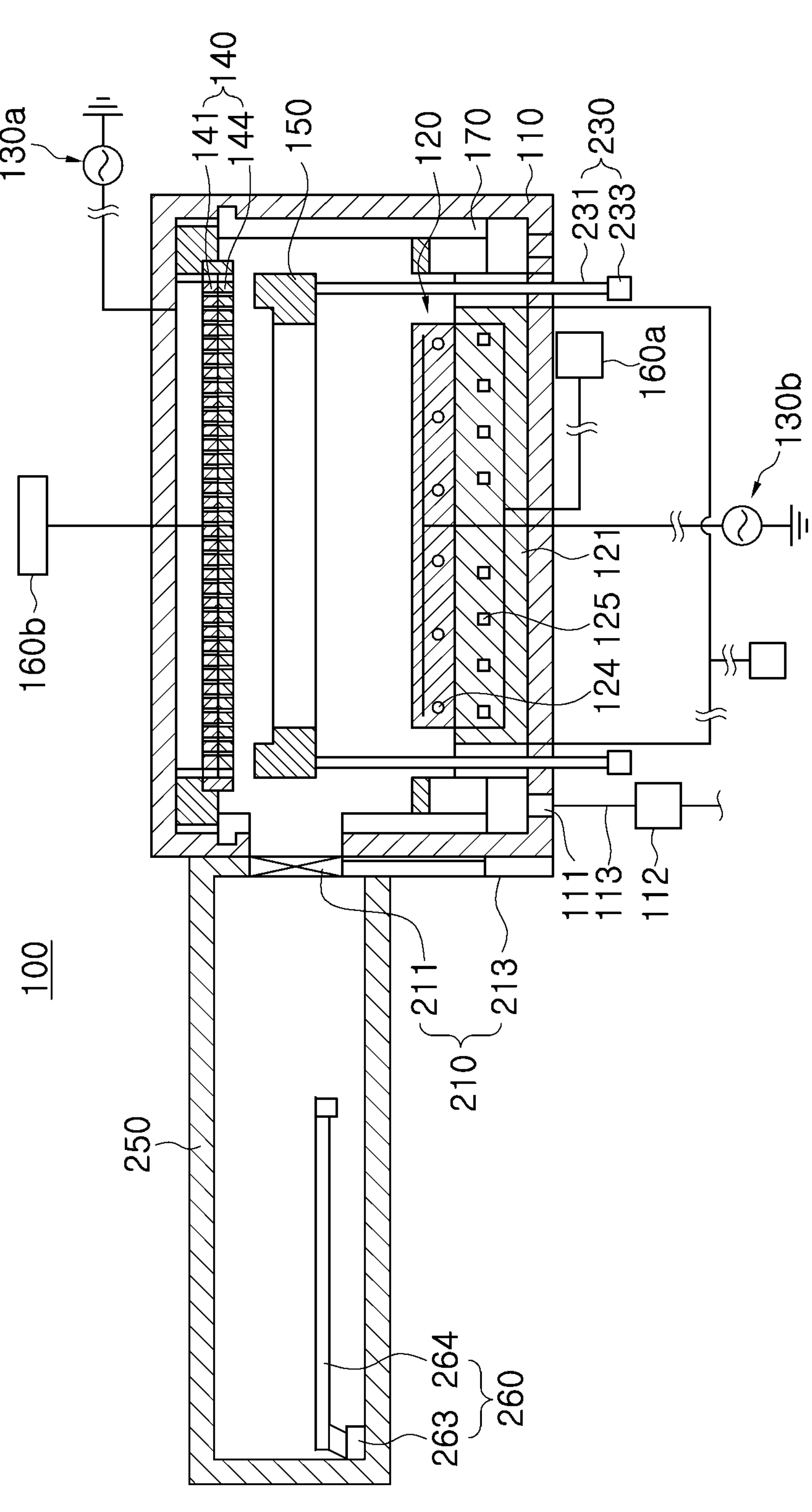

FIGS. 11A to 11C are views illustrating a process of bringing in and mounting a new focus ring in the substrate processing apparatus capable of replacing consumables according to the present disclosure.

As shown in FIG. 11A, the robot arm 264 of the transport means 260 in the buffer chamber 250 may support a new focus ring 150. The new focus ring 150 may be withdrawn from the storage provided in the buffer chamber 250.

As shown in FIG. 11B, a passage may be formed by opening the door 211 of the door means 210, and the robot arm 264 of the transport means 260 may enter the process chamber 110 through the passage while supporting the new focus ring 150.

In a state in which the robot arm 264 has transferred the new focus ring 150 into the process chamber 110, the lifting shafts 231 of the lifting member 230 may ascend to the height of the passage and take over the new focus ring 150 supported by the robot arm 264 as shown in FIG. 11C. After transferring the new focus ring 150 to the lifting shafts 231 of the lifting member 230, the robot arm 264 may return to the inside of the buffer chamber 250.

Then, the lifting shafts 231 of the lifting member 230 descends, so that the new focus ring 150 may be mounted around the substrate support unit 120.

Figure 12A:
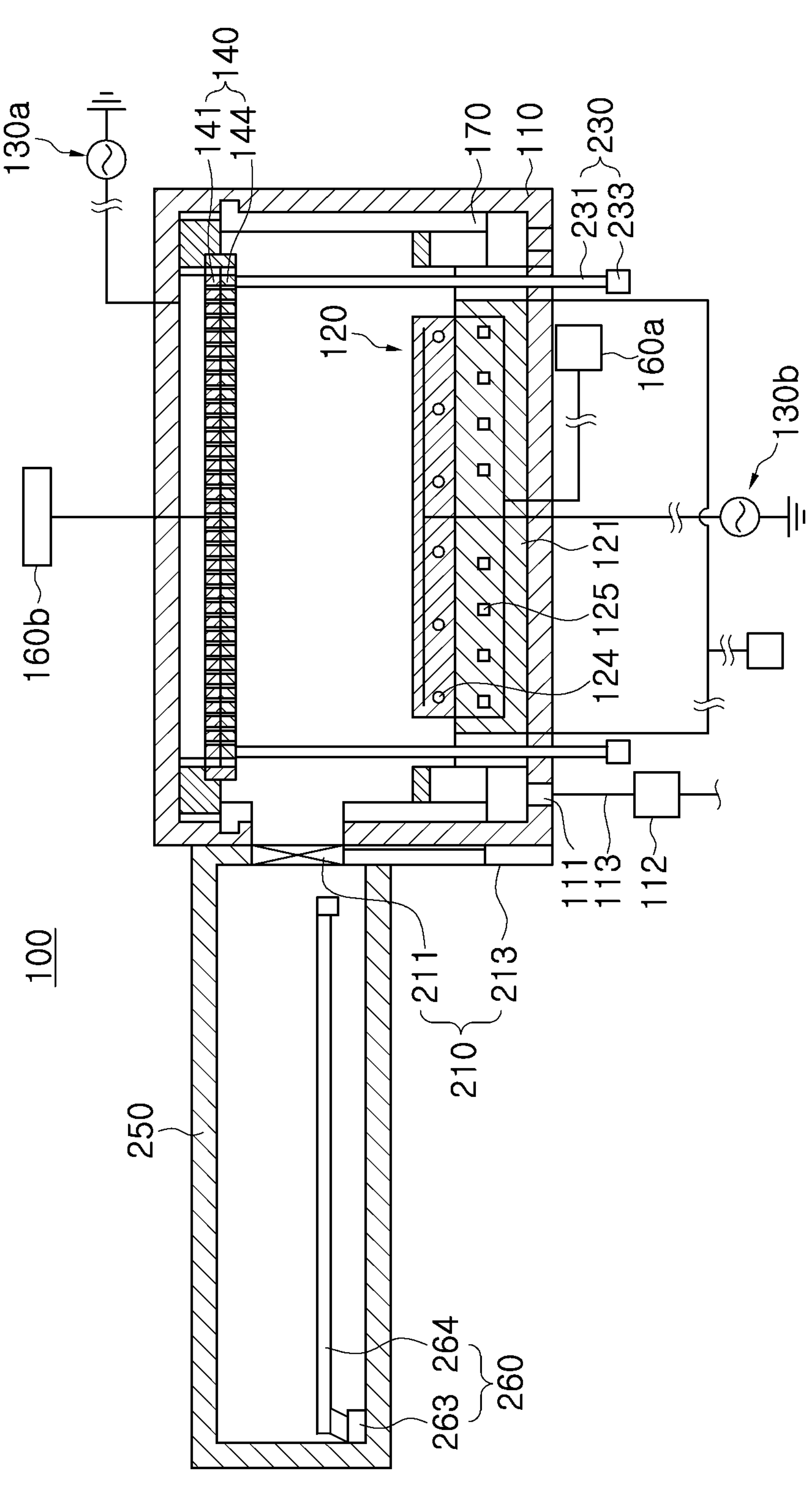
Figure 12B:
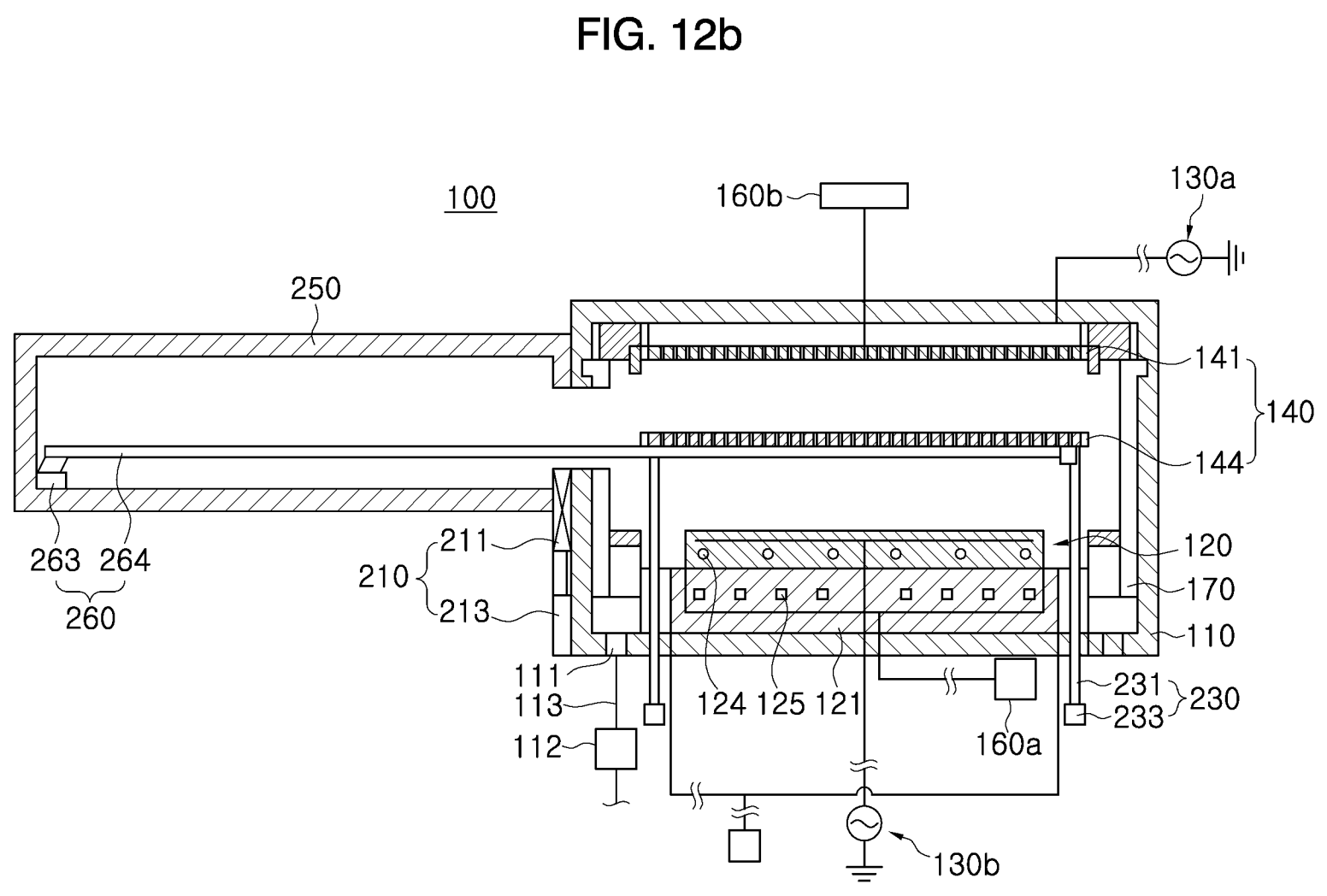
Figure 12C:
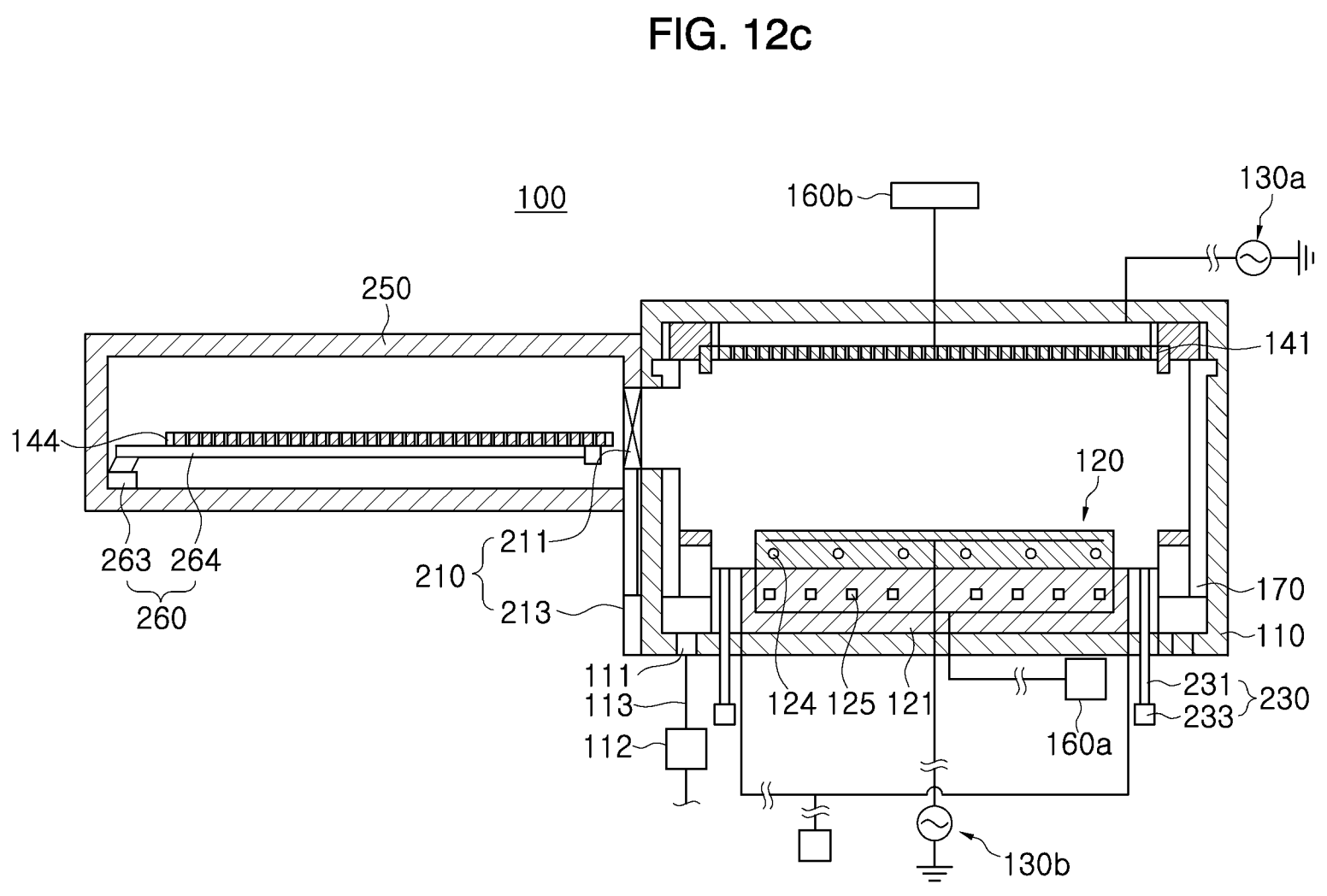

FIGS. 12A to 12C are views illustrating a process of dismounting and discharging a used shower head in the substrate processing apparatus capable of replacing consumables according to the present disclosure.

When the shower head 140 is contaminated and needs to be replaced, the lifting shafts 231 of the lifting member 230 may ascend to the lower surface of the shower head 140 to support the shower head 140 as shown in FIG. 12A.

The shower head 140 may have a structure in which the fixed plate 141 and the replacement plate 144 are stacked, and while the lower surface of the replacement plate 144 is supported by the lifting shafts 231 of the lifting member 230, only the replacement plate 144 may be separated by the detachment means (not shown).

In a state in which the used replacement plate 144 is separated and supported by the lifting shafts 231 of the lifting member 230, the lifting shafts 231 may descend to the height of the door 211 of the door means 210 as shown in FIG. 12B.

In a state in which the used replacement plate 144 is lowered to the door 211 height, a passage may be formed by opening the door 211 of the door means 210. The robot arm 264 of the transport means 260 may enter the process chamber 110 through the passage and take over the used replacement plate 144 supported by the lifting shaft 231.

As shown in FIG. 12C, the robot arm 264 may return to the inner space of the buffer chamber 250 while supporting the used replacement plate 144. The used replacement plate 144 may be stored in the storage provided in the buffer chamber 250.

Figure 13A:
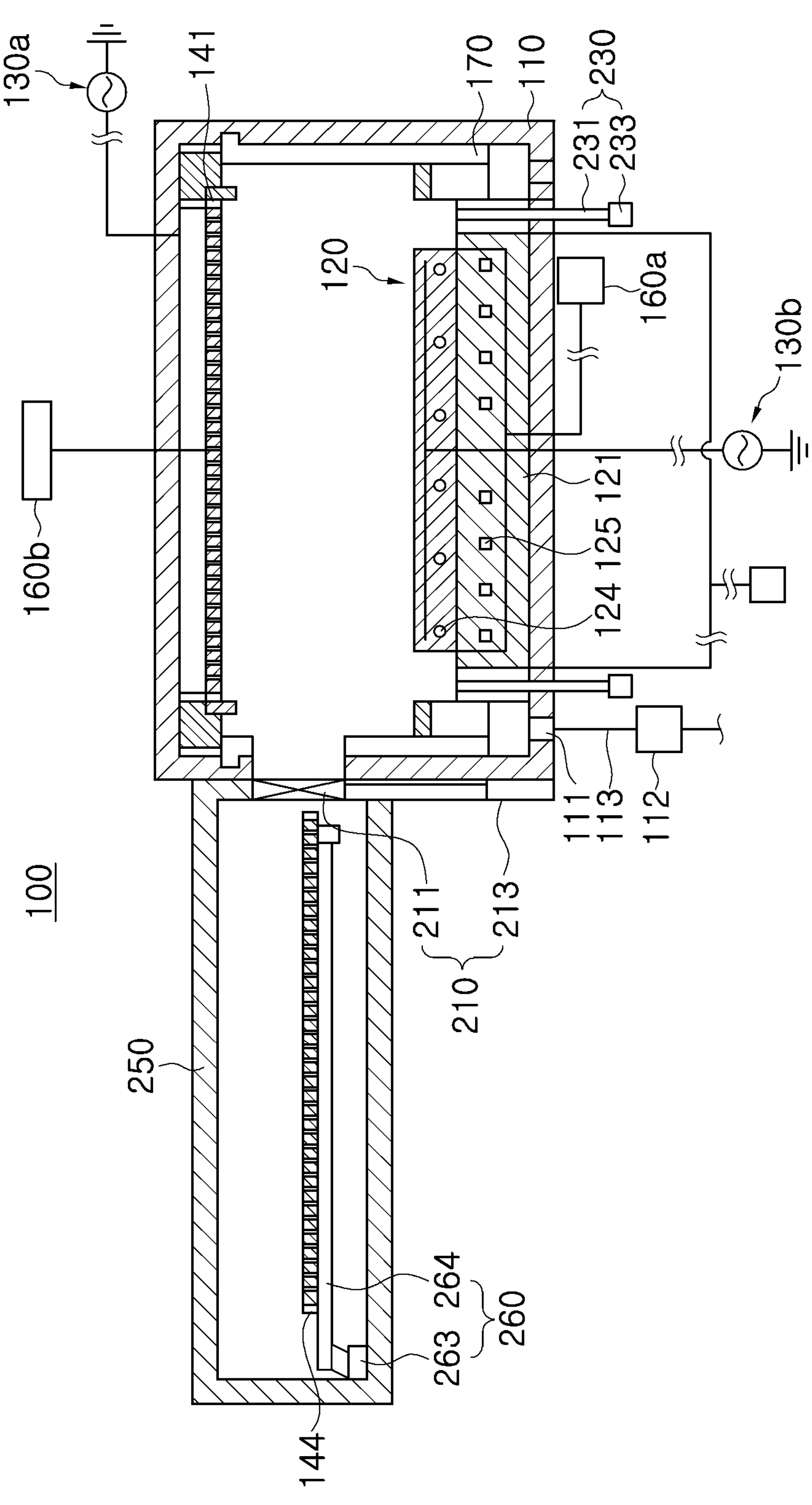
FIGS. 13A to 13C are views illustrating a process of bringing in and mounting a new shower head in the substrate processing apparatus capable of replacing consumables according to the present disclosure.
Figure 13B:
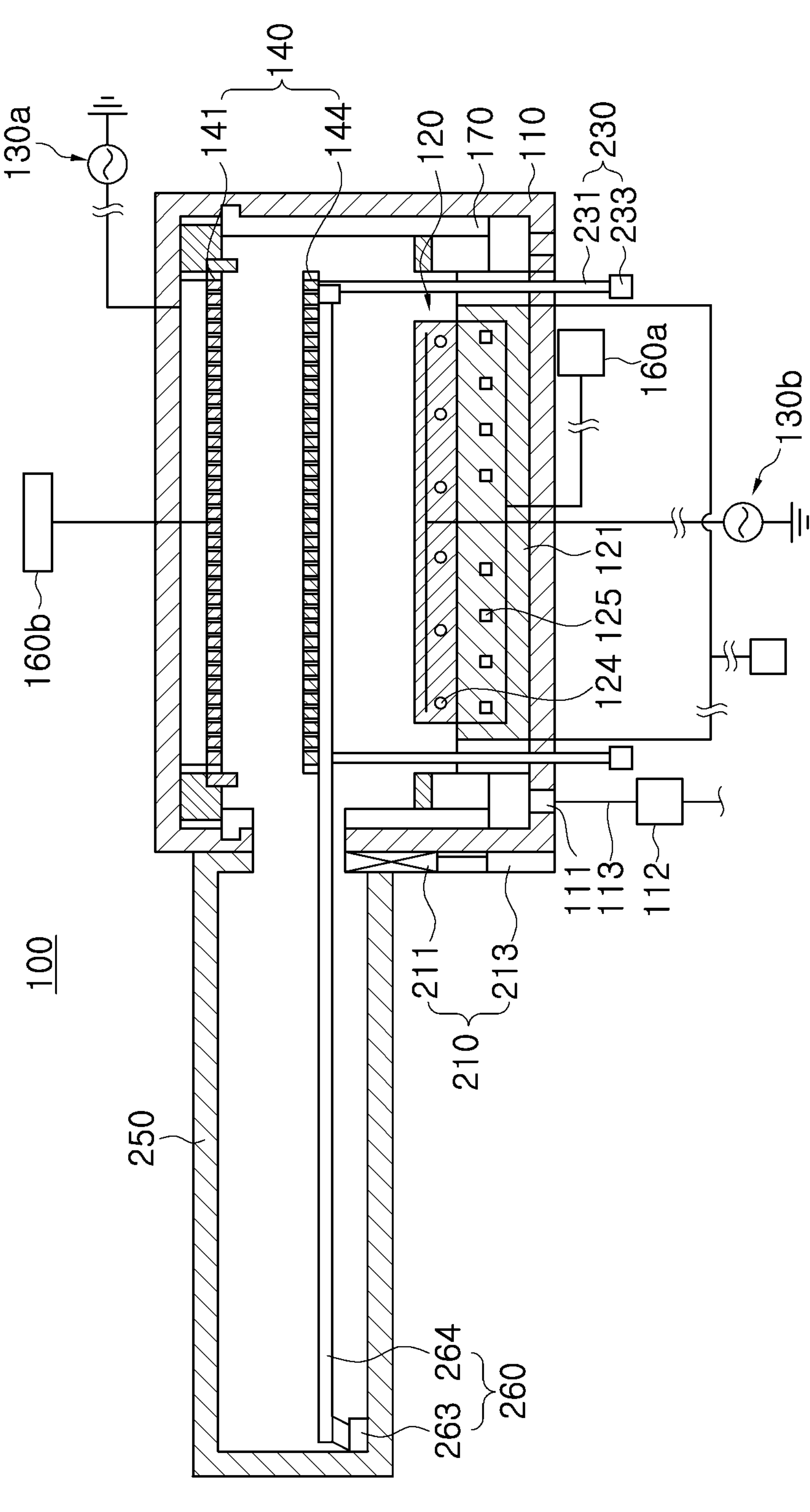
Figure 13C:
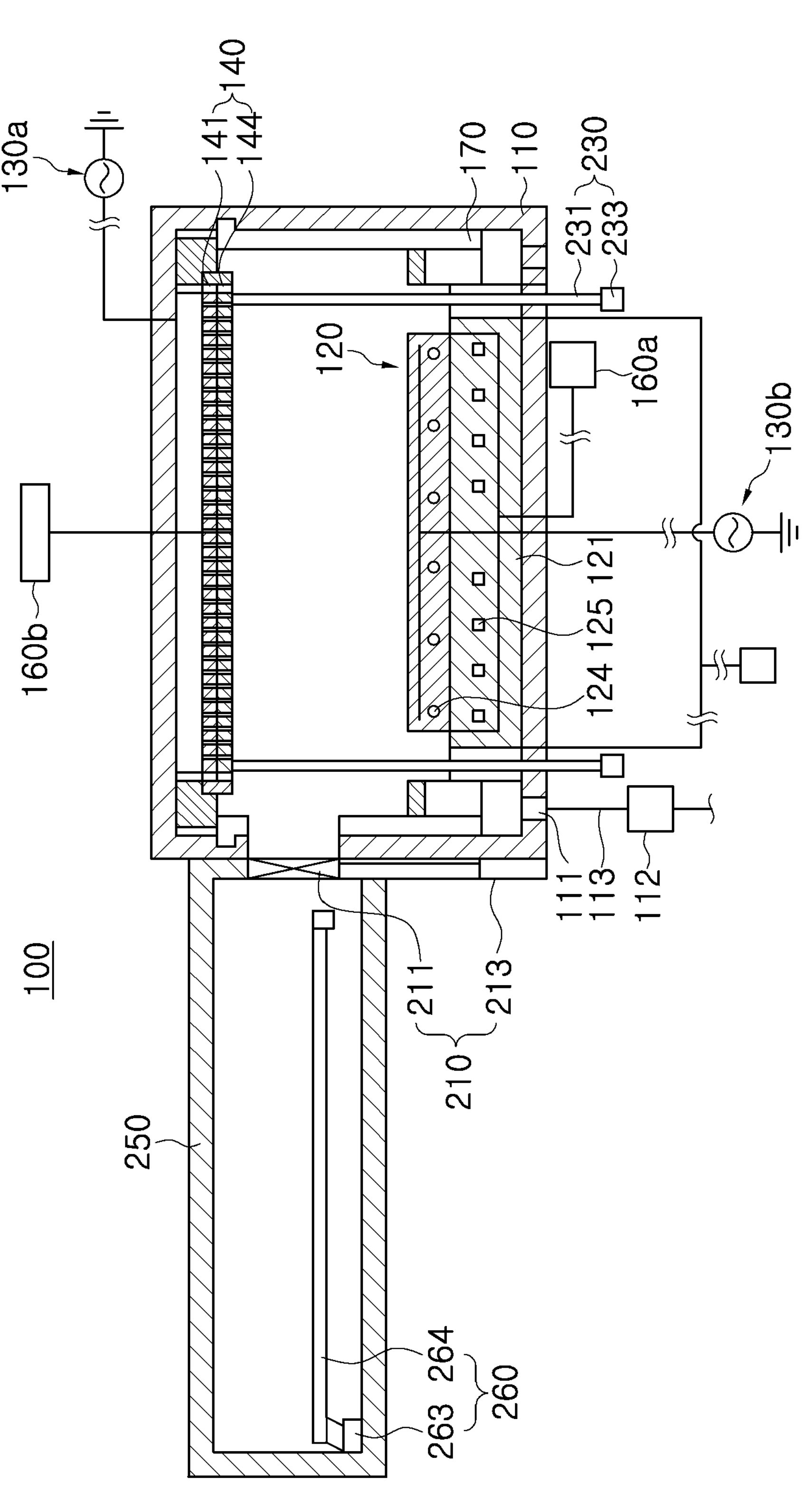

FIGS. 13A to 13C are views illustrating a process of bringing in and mounting a new shower head in the substrate processing apparatus capable of replacing consumables according to the present disclosure.

As shown in FIG. 13A, the robot arm 264 of the transport means 260 may support a new replacement plate 144 in the buffer chamber 250. The new replacement plate 144 may be withdrawn from the storage provided in the buffer chamber 250.

As shown in FIG. 13B, a passage may be formed by opening the door 211 of the door means 210, and the robot arm 264 of the transport means 260 may enter the process chamber 110 through the passage while supporting the new replacement plate 144.

In a state in which the robot arm 264 has transferred the new replacement plate 144 to the inside of the process chamber 110, the lifting shafts 231 of the lifting member 230 may ascend to the height of the passage and take over the new replacement plate 144 supported by the robot arm 264. After transferring the new replacement plate 144 to the lifting shafts 231 of the lifting member 230, the robot arm 264 may return to the inside of the buffer chamber 250.

Then, as shown in FIG. 13C, the lifting shafts 231 of the lifting member 230 ascends, bringing the new replacement plate 144 into contact with the fixed plate 141, and in this state, the detachment means may mount the new replacement plate 144 on the lower surface of the fixed plate 141.

When the installation of the new replacement plate 144 is completed, the lifting shafts 231 of the lifting member 230 may descend and return to its original position.

According to the present disclosure, it is possible to replace consumables such as a shower head and a focus ring while maintaining a chamber processing environment of a substrate processing apparatus.

In particular, when a used shower head or a used focus ring is replaced with a new shower head or a new focus ring, the environment of the process chamber is maintained, so there is no need to recreate the processing environment thereafter, thereby increasing process progress efficiency.

The above description is merely illustrative of the technical idea of the present disclosure, and various modifications and variations may be made by those skilled in the art to which the present disclosure pertains without departing from the essential characteristics of the present disclosure. Therefore, the embodiments described in the present disclosure are not intended to limit the technical spirit of the present disclosure, but to explain, and the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. A substrate processing apparatus, the apparatus comprising:

a process chamber provided with a processing space for performing a substrate processing process;

a lifting member disposed in the process chamber and supporting a part that constitutes the substrate processing apparatus, wherein the part is located in the processing space and the lifting member is configured to lift or lower the part, and wherein the part comprises a shower head disposed in an upper part of the processing space;

a door means provided at a wall surface of the process chamber to selectively provide a passage between the processing space and an exterior to the process chamber according to opening of the door means;

a transport means configured to remove the part from the processing space through the passage of the door means;

a detachment means configured to disassemble the shower head from the process chamber, wherein the shower head includes a fixed plate and a replacement plate, the fixed plate and the replacement plate stacked on each other, wherein the detachment means is configured to disassemble the replacement plate from the fixed plate, wherein the fixed plate includes a plurality of first fastening parts, wherein the replacement plate includes a plurality of second fastening parts that communicate with the plurality of first fastening parts, respectively, and wherein the detachment means includes:

a plurality of fastening members that are inserted into the plurality of first fastening parts, respectively, and that are selectively inserted into the plurality of second fastening parts, respectively, for the disassembly of the replacement plate;

a fastening actuator configured to rotate the plurality of the fastening members;

a torque sensor configured to measure a coupling strength of the plurality of fastening members to the shower head; and a detachment means controller configured to control the fastening actuator based on the coupling strength.

2. The substrate processing apparatus of claim 1, wherein the lifting member comprises:

a lifting shaft configured to ascend or descend while supporting the part in the processing space of the process chamber; and a lifting actuator configured to lift or lower the lifting shaft.

3. The substrate processing apparatus of claim 1, wherein the door means comprises:

a door disposed at the wall surface of the process chamber to selectively open or close the passage leading to the processing space; and a door actuator configured to open or close the door.

4. The substrate processing apparatus of claim 3, further comprising:

a buffer chamber connected to the passage of the door means to maintain a processing environment of the process chamber when the door is open.

5. The substrate processing apparatus of claim 4, wherein the transport means comprises:

a transport robot that is located in the buffer chamber and accesses the processing space through the passage of the door means to remove the part from the processing space.

6. The substrate processing apparatus of claim 4, further comprising:

a storage disposed in the buffer chamber to store the part removed from the processing space.

7. The substrate processing apparatus of claim 1, wherein the lifting member is positioned under the shower head, and lifts or lowers the shower head to remove the shower head from the processing space.

8. The substrate processing apparatus of claim 1, wherein the lifting member lifts or lowers the replacement plate.

9. The substrate processing apparatus of claim 1 wherein each fastening member of the plurality of fastening members is provided with a screw thread such that the fixed plate remains mounted while the replacement plate is selectively disassembled.

10. A substrate processing apparatus, the apparatus comprising:

a process chamber provided with a processing space for performing a substrate processing process;

a lifting member disposed in the process chamber and configured to lift or lower a part that is located in the processing space and constitutes the substrate processing apparatus, and wherein the part comprises a shower head disposed in an upper part of the processing space;

a door means provided at a wall surface of the process chamber to selectively provide a passage between the processing space and an exterior to the process chamber according to opening of the door means;

a transport means configured to remove the part from the processing space through the passage of the door means, wherein the shower head includes a fixed plate and a replacement plate, the fixed plate and the replacement plate stacked on each other, and wherein one of the fixed plate and the replacement plate is provided with a fastening protrusion, and a remaining one is provided with a fastening groove; and a detachment means is configured to rotate the replacement plate to fasten and separate the fastening protrusion into and from the fastening groove so as to mount and dismount the replacement plate to and from the fixed plate, wherein the lifting member contacts the replacement plate during a time when the replacement plate is dismounted from the fixed plate.

11. The substrate processing apparatus of claim 10, wherein the lifting member lifts and lowers the part to a height of the passage of the door means, and wherein the transport means draws out or draws in the part through the passage of the door means.

12. The substrate processing apparatus of claim 11, further comprising:

a buffer chamber provided with a storage for consumables, wherein the lifting member is disposed in the process chamber to lift and lower the part to support dismounting thereof and to lift and lower new consumables provided from the buffer chamber to support mounting thereof, and wherein the transport means unloads the part supported by the lifting member to store the part in the storage of the buffer chamber, and provides a new part stored in the storage of the buffer chamber to the lifting member.

* * * * *